(12) United States Patent
Lee et al.

(10) Patent No.: US 10,211,426 B2
(45) Date of Patent: *Feb. 19, 2019

(54) ROLLABLE DISPLAY DEVICE

(71) Applicant: SAMSUNG DISPLAY CO., LTD., Yongin-si, Gyeonggi-do (KR)

(72) Inventors: Junghun Lee, Yongin-si (KR); Younjoon Kim, Yongin-si (KR); Sangjo Lee, Yongin-si (KR); Jusuck Lee, Yongin-si (KR); Mi Jang, Yongin-si (KR); Kyungmin Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/997,638

(22) Filed: Jun. 4, 2018

(65) Prior Publication Data
US 2018/0287096 A1 Oct. 4, 2018

Related U.S. Application Data

(62) Division of application No. 14/964,361, filed on Dec. 9, 2015, now Pat. No. 9,991,468.

(30) Foreign Application Priority Data

Feb. 2, 2015 (KR) ........................ 10-2015-0016182

(51) Int. Cl.
*H01L 51/52* (2006.01)
*H01L 27/32* (2006.01)

(52) U.S. Cl.
CPC ...... *H01L 51/5253* (2013.01); *H01L 51/5237* (2013.01); *H01L 51/5246* (2013.01);
(Continued)

(58) Field of Classification Search
CPC ........... H01L 2251/5338; H01L 27/323; H01L 51/5237; H01L 51/5246; H01L 51/5253; H01L 51/5281
(Continued)

(56) References Cited

U.S. PATENT DOCUMENTS 8,001,711 B2 * 8/2011 LaFarre .................. G02F 1/167
40/515
9,104,368 B2 * 8/2015 Ka ......................... G06F 1/1601
(Continued)

FOREIGN PATENT DOCUMENTS

JP 2011-204364 10/2011
KR 10-2011-0098692 A 9/2001

*Primary Examiner* — Mohammed Shamsuzzaman
(74) *Attorney, Agent, or Firm* — Lewis Roca Rothgerber Christie LLP

(57) ABSTRACT

A display device includes: a frame; and a flexible display unit configured to be wound into the frame, and including a transparent adhesive layer, the adhesive layer having a first surface and a second surface opposite to the first surface. The adhesive layer is configured to adhere layers on the first surface and the second surface thereof to each other, and a first elongation percentage of the adhesive layer in a first direction is greater than a second elongation percentage of the adhesive layer in a second direction crossing the first direction, the first direction being a direction along which the display unit is unwound from the frame.

13 Claims, 7 Drawing Sheets

(52) U.S. Cl.
CPC ........ *H01L 51/5281* (2013.01); *H01L 27/323* (2013.01); *H01L 2251/5338* (2013.01)

(58) Field of Classification Search
USPC ................. 257/40; 40/515; 349/58; 428/415
See application file for complete search history.

(56) References Cited

U.S. PATENT DOCUMENTS

| | | | |
|---|---|---|---|
| 9,276,055 B1* | 3/2016 | Son | H01L 27/3276 |
| 9,439,315 B2* | 9/2016 | Lee | H05K 7/00 |
| 9,448,592 B2* | 9/2016 | Jin | H01L 51/5253 |
| 2002/0070910 A1* | 6/2002 | Fujieda | G06F 1/1615 |
| | | | 345/85 |
| 2003/0077453 A1* | 4/2003 | Oaku | B32B 17/10036 |
| | | | 428/415 |
| 2006/0007368 A1 | 1/2006 | Slikkerveer et al. | |
| 2006/0142412 A1* | 6/2006 | Yamaoka | B32B 7/12 |
| | | | 523/111 |
| 2011/0187960 A1 | 8/2011 | Kobayashi et al. | |
| 2012/0064275 A1* | 3/2012 | Fumoto | C09J 7/40 |
| | | | 428/41.5 |
| 2012/0328800 A1 | 12/2012 | Yoon et al. | |
| 2013/0038820 A1* | 2/2013 | Chen | G06F 1/1652 |
| | | | 349/86 |
| 2013/0260120 A1 | 10/2013 | Hirayama et al. | |
| 2014/0041800 A1* | 2/2014 | Okuyama | B29C 65/1432 |
| | | | 156/247 |
| 2016/0079329 A1* | 3/2016 | Lee | G06F 1/1643 |
| | | | 257/40 |
| 2016/0118416 A1* | 4/2016 | Yamazaki | H01L 27/1225 |
| | | | 349/38 |

* cited by examiner

ROLLABLE DISPLAY DEVICE

CROSS-REFERENCE TO RELATED APPLICATION

This application is a divisional of U.S. patent application Ser. No. 14/964,361, filed Dec. 9, 2015, which claims priority to and the benefit of Korean Patent Application No. 10-2015-0016182, filed Feb. 2, 2015, the entire content of both of which is incorporated herein by reference.

BACKGROUND

1. Field

One or more exemplary embodiments of the present invention relate to a display device.

2. Description of the Related Art

Together with the recent efforts to provide electronic devices having various shapes, studies are being conducted to provide displays mounted on the electronic devices having various shapes.

Because organic light-emitting display apparatuses are self-emissive display apparatuses that do not require a separate light source, the organic light-emitting display apparatuses may be driven at low power and may be lightweight and thin. Furthermore, the organic light-emitting display apparatuses are receiving attention as next-generation display apparatuses due to their high quality characteristics, such as a wide viewing angle, high contrast, and quick response speed.

SUMMARY

One or more exemplary embodiments of the present invention include a rollable display device.

Additional aspects will be set forth, in part, in the description which follows and, in part, will be apparent from the description or may be learned by practice of the presented embodiments.

According to one or more exemplary embodiments of the present invention, a display device includes: a frame; and a flexible display unit configured to be wound into the frame, and including a transparent adhesive layer, the adhesive layer having a first surface and a second surface opposite to the first surface. The adhesive layer is configured to adhere layers on the first surface and the second surface thereof to each other, and a first elongation percentage of the adhesive layer in a first direction is greater than a second elongation percentage of the adhesive layer in a second direction crossing the first direction, the first direction being a direction along which the display unit is unwound from the frame.

The first direction and the second direction may be perpendicular to each other.

The adhesive layer may include a base and a plurality of modulus adjusting areas, and the plurality of modulus adjusting areas may each extend in the second direction and may be separated from each other along the first direction.

The base and the plurality of modulus adjusting areas may be alternately arranged along the first direction on a surface of the adhesive layer, and the plurality of modulus adjusting areas may extend in a depth direction of the adhesive layer from the surface of the adhesive layer such that the base is at at least three sides of each of the plurality of modulus adjusting areas.

A depth of each of the plurality of modulus adjusting areas may be in a range of 10% to 90% of a thickness of the adhesive layer.

A depth of each of the plurality of modulus adjusting areas may be in a range of 10% to 50% of a thickness of the adhesive layer.

The first elongation percentage may increase from one edge to an opposite edge of the adhesive layer, and the one edge may be closer to the frame than the opposite edge.

Intervals between adjacent ones of the plurality of modulus adjusting areas may decrease from the one edge to the opposite edge.

A depth of each of the plurality of modulus adjusting areas may increase from the one edge to the opposite edge.

The plurality of modulus adjusting areas may be spaced from the one edge and the opposite edge.

The plurality of modulus adjusting areas may include a plurality of first modulus adjusting areas extending in a depth direction of the adhesive layer from the first surface of the adhesive layer, and a plurality of second modulus adjusting areas extending in a depth direction of the adhesive layer from the second surface of the adhesive layer.

The plurality of first modulus adjusting areas and the plurality of second modulus adjusting areas may be alternately arranged.

The flexible display unit may include a flexible substrate, a display layer on the flexible substrate, a thin-film encapsulation layer sealing the display layer, and a functional layer on the thin-film encapsulation layer, and the adhesive layer may adhere the thin-film encapsulation layer and the functional layer to each other.

According to one or more exemplary embodiments of the present invention, a display device including a flexible display unit configured to be wound in a roll shape, the flexible display unit including: a flexible substrate; a display layer on the flexible substrate; a thin-film encapsulation layer sealing the display layer; a functional layer on the thin-film encapsulation layer; and an adhesive layer between the thin-film encapsulation layer and the functional layer, the adhesive layer including a base and a plurality of modulus adjusting areas having a line shape in a region of the base, wherein the plurality of modulus adjusting areas are separated from each other along a first direction to form a stripe pattern, the base and the plurality of modulus adjusting areas include a same material, and a first modulus of the base is greater than a second modulus of the plurality of modulus adjusting areas.

A first elongation percentage of the adhesive layer in the first direction may be greater than a second elongation percentage of the adhesive layer in a second direction crossing the first direction.

The first direction and the second direction may be perpendicular to each other.

Each of the plurality of modulus adjusting areas may extend in the second direction.

The base and the plurality of modulus adjusting areas may be alternately arranged on a surface of the adhesive layer in the first direction, and the plurality of modulus adjusting areas may extend in a depth direction of the adhesive layer from the surface of the adhesive layer such that the base is at at least three sides of each of the plurality of the modulus adjusting areas.

The display device may further include a frame configured to accommodate the flexible display unit wound in the roll shape, and the first direction may be a direction along which the flexible display unit is unwound from the frame.

The first elongation percentage may increase from one edge to an opposite edge of the adhesive layer, and the one edge may be closer to the frame than the opposite edge.

Intervals between adjacent ones of the plurality of modulus adjusting areas may decrease from the one edge to the opposite edge.

Depths of the plurality of modulus adjusting areas may increase from the one edge to the opposite edge.

A depth of each of the plurality of modulus adjusting areas may be in a range of 10% to 90% of a thickness of the adhesive layer.

A depth of each of the plurality of modulus adjusting areas may be in a range of 10% to 50% of a thickness of the adhesive layer.

The plurality of modulus adjusting areas may include a plurality of first modulus adjusting areas extending in a depth direction of the adhesive layer from a first surface of the adhesive layer, and a plurality of second modulus adjusting areas extending in a depth direction of the adhesive layer from a second surface of the adhesive layer, the second surface being opposite to the first surface.

The plurality of first modulus adjusting areas and the plurality of second modulus adjusting areas may be alternately arranged.

The display layer may include an organic light-emitting diode and a thin-film transistor electrically connected to the organic light-emitting diode.

The functional layer may include a polarization layer, a touch screen layer, and a protection layer, and the adhesive layer may adhere the polarization layer, the touch screen layer, and the protection layer to each other.

BRIEF DESCRIPTION OF THE DRAWINGS

These and/or other aspects will become apparent and more readily appreciated from the following description of exemplary embodiments of the present invention, taken in conjunction with the accompanying drawings in which.

DETAILED DESCRIPTION

Figure 1:
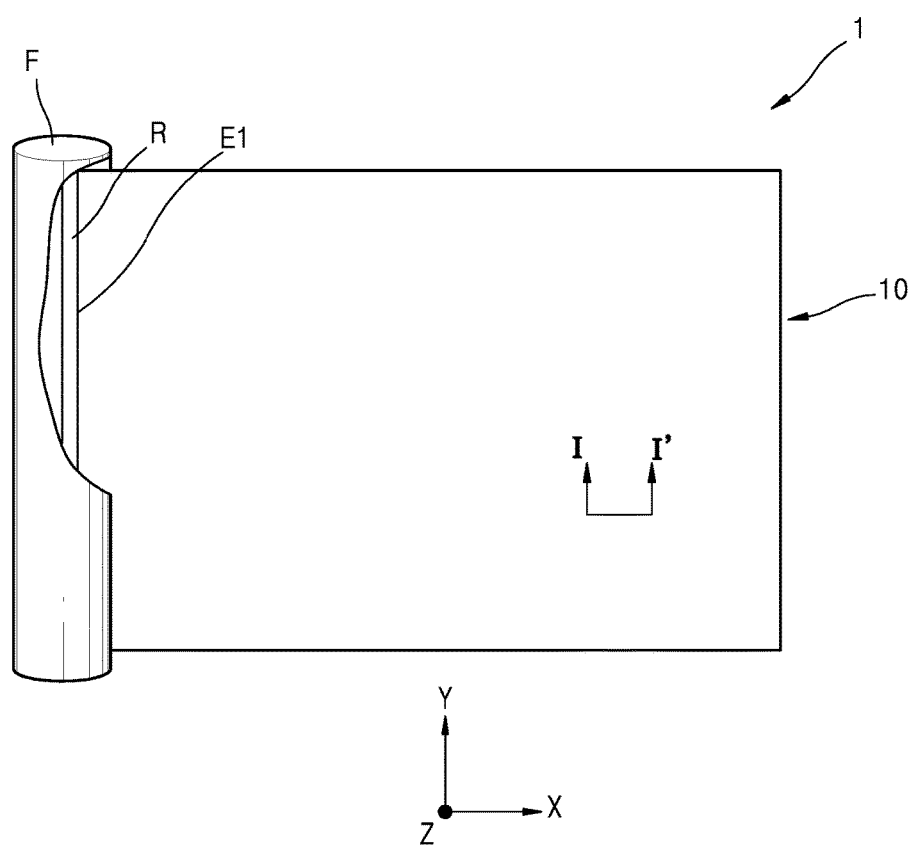
FIG. 1 is a partially exposed perspective view of a rollable display device according to an exemplary embodiment of the present invention.

As the present invention allows for various changes and numerous embodiments, particular embodiments will be illustrated in the drawings and described in detail in the written description. However, this is not intended to limit the present invention to particular modes of practice, and it will to be appreciated that all changes, equivalents, and substitutes that do not depart from the spirit and technical scope of the present invention are encompassed in the present invention. In the description of the present invention, certain detailed explanations of related art that unnecessarily obscure the essence of the invention may be omitted.

It will be understood that although the terms "first", "second", etc. may be used herein to describe various components, these components should not be limited by these terms. These terms are only used to distinguish one component from another. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting of the invention. As used herein, the singular forms "a" and "an" are intended to include the plural forms as well, unless the context clearly indicates otherwise. Sizes of components in the drawings may be exaggerated for convenience of explanation. Because sizes and thicknesses of components in the drawings may be arbitrarily illustrated for convenience of explanation, the following embodiments are not limited thereto.

When a component is described to be on or under another component, the component may be directly or indirectly on the other component, and a criterion regarding on and under is based on drawings. It will be understood that the spatially relative terms are intended to encompass different orientations of the device in use or operation in addition to the orientation depicted in the figures. It will be further understood that when an element or layer is referred to as being "on", "connected to", or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Further, the use of "may" when describing embodiments of the present invention relates to "one or more embodiments of the present invention". Also, the term "exemplary" is intended to refer to an example or illustration.

As used herein, the term "and/or" includes any and all combinations of one or more of the associated listed items. Expressions, such as "at least one of," when preceding a list of elements modify the entire list of elements and do not modify the individual elements of the list.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

One or more exemplary embodiments of the present invention will be described below in more detail with reference to the accompanying drawings. Those components that are the same or substantially the same are indicated with the same reference numeral regardless of the figure number, and redundant explanations thereof may be omitted.

Figure 2:
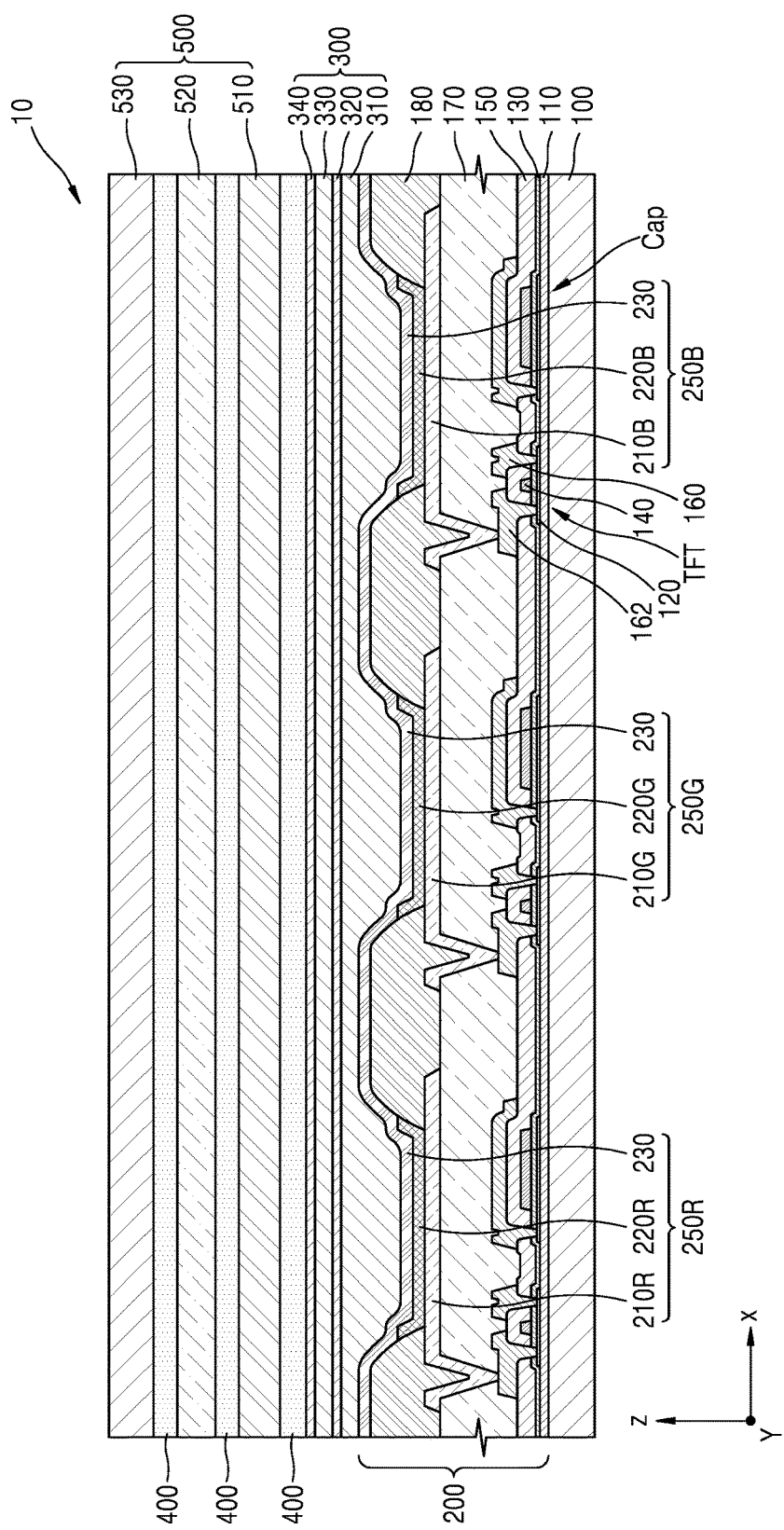
FIG. 2 is a cross-sectional view taken along the line I-I' of FIG. 1.
Figure 3:
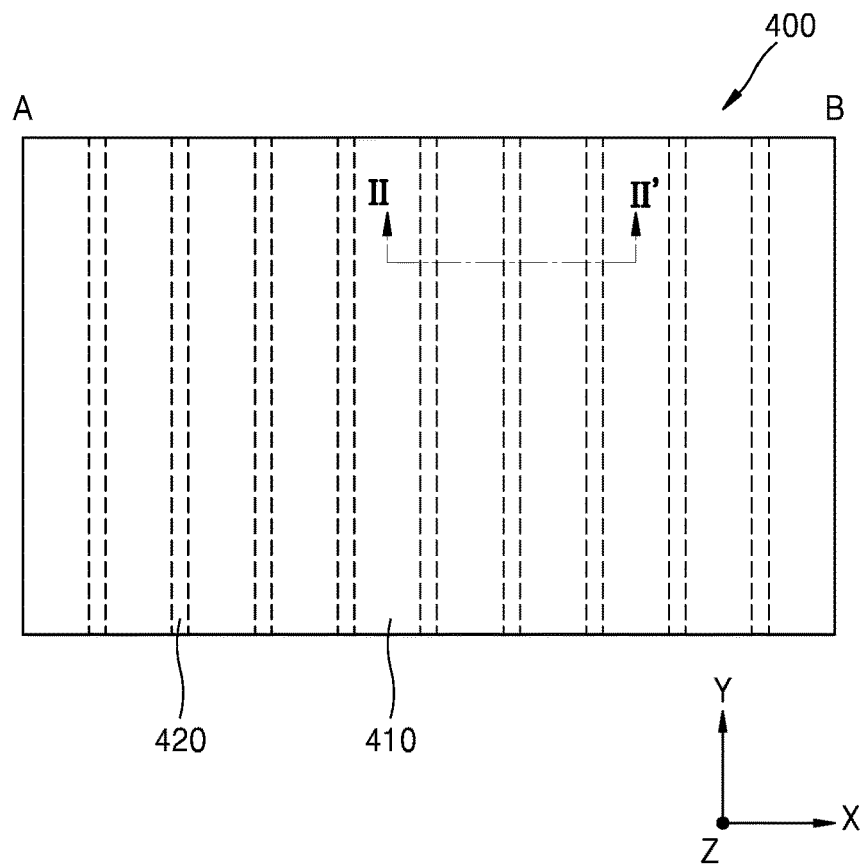
FIG. 3 is a plan view of an adhesive layer of the rollable display device shown in FIG. 1, according to an exemplary embodiment of the present invention.
Figure 4:
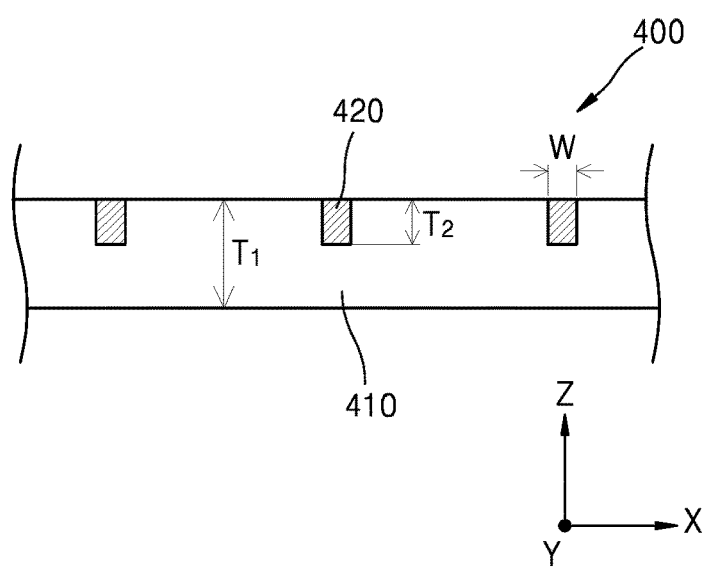
FIG. 4 is a cross-sectional view taken along the line II-II' of FIG. 3, according to an exemplary embodiment of the present invention.

FIG. 1 is a partially exposed perspective view of a rollable display device 1 according to an exemplary embodiment of the present invention, FIG. 2 is a cross-sectional view taken along the line I-I' of FIG. 1, FIG. 3 is a plan view of an adhesive layer 400 of the rollable display device 1 shown in FIG. 1 according to an exemplary embodiment of the present invention, and FIG. 4 is a cross-sectional view taken along the line II-II' of FIG. 3 according to an exemplary embodiment of the present invention.

Referring to FIGS. 1 through 4, the rollable display device 1 according to an exemplary embodiment of the present invention may include a frame F and a flexible display unit 10 that is windable (e.g., retractable) into the frame F.

The frame F provides a space for the flexible display unit 10 to be rolled into (e.g., stored) and may include a rod R combined to or connected to one edge E1 of the flexible display unit 10. The flexible display unit 10 may be wound by using the rod R as a central axis (e.g., the flexible display unit 10 may be wound about the rod R as the central axis) and may also be unwound from (e.g., extended from) the frame F. Accordingly, the rollable display device 1 may be easily carried and stored, and the flexible display unit 10 may be protected from an external impact. In FIG. 1, the frame F has a roll shape (e.g., a tubular shape), but exemplary embodiments of the present invention are not limited thereto and the frame F may have any suitable shape as long as the frame F has a space for the flexible display unit 10 to be rolled into.

The flexible display unit 10 will now be described in more detail with reference to FIG. 2.

The flexible display unit 10 may include a flexible substrate 100, a display layer 200 formed on the flexible substrate 100, a thin-film encapsulation layer 300 sealing the display layer 200, and a functional layer 500 disposed on the thin-film encapsulation layer 300.

For example, the functional layer 500 may include a polarization layer d, a touch screen layer 520, and a protection layer 530. However, exemplary embodiments of the present invention are not limited thereto, and the flexible display unit 10 may include one or more of the polarization layer 510, the touch screen layer 520, and the protection layer 530 or may further include another functional layer.

The flexible display unit 10 may include at least one adhesive layer 400. The adhesive layer 400 may be transparent and adheres layers respectively located on a first surface thereof and a second surface thereof that is opposite to the first surface. For example, the adhesive layer 400 may be disposed between the thin-film encapsulation layer 300 and the functional layer 500 to adhere the thin-film encapsulation layer 300 and the functional layer 500 to each other. The polarization layer 510, the touch screen layer 520, and the protection layer 530 included in the functional layer 500 may be adhered to each other by adhesive layers 400.

The flexible substrate 100 is flexible and may be formed of any suitable material, such as a metal material or a plastic material such as polyethylene terephthalate (PET), polyethylene naphthalate (PEN), and/or polyimide. In some embodiments, the flexible substrate 100 may be formed of a thin metal foil, such as steel use stainless (SUS).

A buffer layer 110 formed of silicon oxide and/or silicon nitride may be disposed on the flexible substrate 100 so as to prevent impurities from penetrating into a semiconductor layer 120 of a thin-film transistor TFT.

The display layer 200 may include the thin-film transistor TFT, a capacitor Cap, and an organic light-emitting diode (OLED) electrically connected to the thin-film transistor TFT.

The thin-film transistor TFT may include the semiconductor layer 120 including amorphous silicon, polycrystalline silicon, an oxide semiconductor, and/or an organic semiconductor, a gate electrode 140, a source electrode 160, and a drain electrode 162.

The semiconductor layer 120 may be disposed on the buffer layer 110. The gate electrode 140 is disposed above the semiconductor layer 120, and the source electrode 160 and the drain electrode 162 are electrically connected to each other based on (e.g., according to) a signal applied to the gate electrode 140.

The gate electrode 140 may be formed, for example, as a single layer or having a multi-layer structure formed of one or more materials, such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W width), and/or copper (Cu), by considering adhesion with an adjacent layer, surface flatness of a stacked layer, and processability of the gate electrode 140.

A gate insulating film 130 formed of silicon oxide and/or silicon nitride may be disposed between the semiconductor layer 120 and the gate electrode 140.

An interlayer insulating film 150 may be disposed on the gate electrode 140. The interlayer insulating film 150 may be formed as a single layer or having a multi-layer structure formed of one or more materials, such as silicon oxide and/or silicon nitride.

The source electrode 160 and the drain electrode 162 are disposed on the interlayer insulating film 150. The source electrode 160 and the drain electrode 162 are electrically connected to the semiconductor layer 120 respectively through contact openings (e.g., contact holes) formed on the interlayer insulating film 150 and the gate insulating film 130.

The source electrode 160 and the drain electrode 162 may each be formed as a single layer or having a multi-layer structure formed of one or more materials, such as Al, Pt, Pd, Ag, Mg, Au, Ni, Nd, Ir, Cr, Li, Ca, Mo, Ti, W, and/or Cu.

A first insulating film 170 may be disposed on the source electrode 160 and the drain electrode 162. When the OLED is disposed on the thin-film transistor TFT, the first insulating film 170 flattens a top surface of the thin-film transistor TFT (e.g., provides a planar surface above the thin-film transistor TFT) and protects the thin-film transistor TFT and other various devices. The first insulating film 170 may be formed of an acryl-based organic material, benzocyclobutene (BCB), and/or an inorganic material.

A second insulating film 180 may be disposed on the thin-film transistor TFT. The second insulating film 180 may be a pixel-defining film. The second insulating film 180 may be disposed on the first insulating film 170 and may include openings. The second insulating film 180 defines pixel regions on the flexible substrate 100.

The second insulating film 180 may be an organic insulating film. The organic insulating film may contain an acryl-based polymer, such as poly(methyl methacrylate) (PMMA), polystyrene (PS), a polymer derivative having a phenol group, an imide-based polymer, an aryl ether-based polymer, an amide-based polymer, a fluorine-based polymer, a p-xylene-based polymer, a vinyl alcohol-based polymer, and/or a mixture thereof.

The OLEDs forming a red sub-pixel 250R, a green sub-pixel 250G, and a blue sub-pixel 250B may be disposed in the pixel regions defined by the second insulating film 180. The red sub-pixel 250R may include a red-emitting pixel electrode 210R, a red-emitting intermediate layer 220R, and a counter electrode 230, the green sub-pixel 250G may include a green-emitting pixel electrode 210G, a green-emitting intermediate layer 220G, and the counter electrode 230, and the blue sub-pixel 250B may include a blue-emitting pixel electrode 210G, a blue-emitting intermediate layer 220B, and the counter electrode 230.

The red, green, and blue-emitting pixel electrodes 210R, 210G, and 210B are each connected to respective thin-film transistors TFT and may each be a transparent electrode or a reflective electrode. When the red, green, and blue-emitting pixel electrodes 210R, 210G, and 210B are each a transparent electrode, they may be formed of indium tin oxide (ITO), indium zinc oxide (IZO), zinc oxide (ZnO), indium oxide (In2O3), indium gallium oxide (IGO), and/or aluminum zinc oxide (AZO). When the red, green, and blue-emitting pixel electrodes 210R, 210G, and 210B are each a reflective electrode, they may each include a reflective film formed of Ag, Mg, Al, Pt, Pd, Au, Ni, Nd, Ir, Cr, or a compound or alloy thereof and a layer formed of ITO, IZO, ZnO, In$_2$O$_3$, IGO, and/or AZO. However, exemplary embodiments of the present invention are not limited thereto, and the red, green, and blue-emitting pixel electrodes 210R, 210G, and 210B may each be formed of any suitable material and may each be a single layer or may have a multi-layer structure.

The red, green, and blue-emitting intermediate layers 220R, 220G, and 220B may respectively include emission layers (EML) for emitting red, green, and blue light and may each further include a hole injection layer (HIL), a hole transport layer (HTL), an electron transport layer (ETL), and/or an electron injection layer (EIL). However, the red, green, and blue-emitting intermediate layers 220R, 220G, and 220B are not limited thereto and may have any suitable structure.

The counter electrode 230 may be a common electrode of the red sub-pixel 250R, the green sub-pixel 250G, and the blue sub-pixel 250B. The counter electrode 230 may be a transparent electrode or a reflective electrode.

When the counter electrode 230 is a transparent electrode, the counter electrode 230 may include a layer formed of a metal having a low work function, such as Li, Ca, LiF/Ca, LiF/Al, Al, Ag, Mg, or a compound or alloy thereof, and a transparent conductive layer formed of ITO, IZO, ZnO, and/or In2O3. When the counter electrode 230 is a reflective electrode, the counter electrode 230 may include a layer formed of Li, Ca, LiF/Ca, LiF/Al, Al, Ag, Mg, or a compound or alloy thereof. However, a structure and a material of the counter electrode 230 are not limited thereto and may vary.

The thin-film encapsulation layer 300 may seal the display layer 200 to prevent external oxygen and moisture from penetrating into the display layer 200. The thin-film encapsulation layer 300 may include a plurality of organic films 310 and 330 and a plurality of inorganic films 320 and 340. For example, the organic films 310 and 330 and the inorganic films 320 and 340 may be alternately stacked on each other to form a multi-layer structure.

The organic films 310 and 330 may include an acryl-based resin, a methacryl-based resin, polyisoprene, a vinyl-based resin, an epoxy-based resin, a cellulose-based resin, and/or a perylene-based resin.

The inorganic films 320 and 340 may include silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The functional layer 500 may be disposed on the thin-film encapsulation layer 300. For example, the functional layer 500 may include the polarization layer 510, the touch screen layer 520, and/or the protection layer 530 and may further include other functional layers. In FIG. 2, the polarization layer 510, the touch screen layer 520, and the protection layer 530 are sequentially disposed in the stated stacked order, but the stacked order is not limited thereto and may vary.

The polarization layer 510 may transmit light vibrating in a same direction as a polarization axis and absorb or reflect light vibrating in other directions from light emitted from the display layer 200. For example, the polarization layer 510 may include a phase difference film that changes linear polarized light to circular polarized light or vice versa by imparting a phase difference of $\lambda/4$ to two polarization components that are perpendicular to each other, and a polarization film that aligns directions of light passed through the phase difference film divides the light into two polarization components perpendicular to each other and transmits one of the two polarization components while absorbing or distributing the other, but a structure of the polarization layer 510 is not limited thereto.

The touch screen layer 520 may include a touch sensor in which a first electrode and a second electrode cross each other. The touch sensor may be, for example, a capacitance type in which contact is determined or sensed by detecting a change of capacitance generated at a plurality of first electrodes and a plurality of second electrodes which are arranged to cross each other.

The protection layer 530 is flexible and may protect the display layer 200 from an external impact. The protection layer 530 may be formed of PET, PS, PEN, polyethersulfone (PES), and/or polyethylene (PE).

The adhesive layer 400 may be disposed between the thin-film encapsulation layer 300 and the functional layer 500. For example, the adhesive layer 400 may be disposed between the polarization layer 510 and the touch screen layer 520 and between the touch screen layer 520 and the protection layer 530 to adhere them to each other. The adhesive layer 400 may be formed of a silicon-based adhesive and/or an acryl-based adhesive and may further include a hardening agent, a cross-linking agent, and/or a ultraviolet ray (UV) stabilizer. The adhesive layer 400 may be pressure sensitive adhesive (PSA) or an optical clear adhesive (OCA).

Referring to FIG. 3, the adhesive layer 400 may include a base 410 and a plurality of modulus adjusting areas 420. The plurality of modulus adjusting areas 420 may be formed in a partial region of the base 410, extend in a second direction Y, and form a stripe pattern by being separated from each other in a first direction X (e.g., by being arranged along the first direction X). In this embodiment, the first direction X is a direction in which the flexible display unit 10 is unwound from the frame F, and the second direction Y may be a direction crossing the first direction X. A third direction Z is a thickness direction of the flexible display unit 10. For example, the second direction Y may be perpendicular to the first direction X. Accordingly, the base 410 and the modulus adjusting areas 420 may be alternately arranged along the first direction X on a surface of the adhesive layer 400.

The base 410 and the modulus adjusting areas 420 may be formed of the same material. However, the base 410 may have a first modulus and the modulus adjusting areas 420 may have a second modulus smaller than the first modulus. As used herein, modulus denotes an elastic modulus regarding tension or stiffness, and the adhesive layer 400 is relatively hard, has relatively high adhesive strength, and relatively high restoring force when its modulus is high. On the other hand, when its modulus is low, the adhesive layer 400 may have relatively high stretchability.

The modulus adjusting areas 420 may be formed by performing corona discharge or irradiating plasma locally on the base 410. Links of cross-linking agents in an adhesive may be broken in a region of the base 410 on which the corona discharge is performed or plasma is irradiated. Thus, the modulus adjusting areas 420 may have a smaller modulus than the base 410 (e.g., the modulus adjusting areas 420 may have a smaller modulus value than that of the base 410). For example, the first modulus of the base 410 may be in a range of 3 to 10 Kgf/cm$^2$ and the second modulus of the modulus adjusting areas 420 may be in a range of 0.1 to 2 Kgf/cm$^2$.

As such, because the modulus adjusting areas 420, which have a smaller modulus than the base 410, are separated from each other along the first direction X, a first elongation percentage of the adhesive layer 400 in the first direction X may be greater than a second elongation percentage of the adhesive layer 400 in the second direction Y. As used herein, an elongation percentage is a percentage of an elongated length with respect to an initial length when a tensile load is applied. For example, the first elongated percentage in the first direction X may be in a range of about 100% to 1000% and the second elongation percentage in the second direction Y perpendicular to the first direction X may be in a range of about 0% to 100%.

The adhesive layer 400 may have excellent adhesive strength and excellent restoring force due to the base 410 having a high modulus and may have a high elongation percentage due to the modulus adjusting areas 420 arranged along the first direction X. Accordingly, adhesive strength between the thin-film encapsulation layer 300 and the functional layer 500 is maintained while a stress generated and accumulated as the flexible display unit 10 recedes away from (e.g., extends from) the winding axis thereof is effectively distributed when the flexible display unit 10 is wound in a roll shape.

The modulus adjusting areas 420 may be spaced from one edge A and another edge B of the adhesive layer 400. in this embodiment, the one edge A is close to the frame F and the other edge B is opposite to the one edge A. Because the one edge A is a region where the stress is least accumulated when the flexible display unit 10 is wound, the base 410 having a high modulus may be at the one edge A (e.g., the modulus adjusting areas 420 may be spaced from the one edge A). Also, the base 410 having high adhesive strength may be at the other edge B in order to reduce or prevent deformation of the flexible display unit 10 caused as the adhesive layer 400 is extended away from the winding axis.

Energy transmitted to the adhesive layer 400 when corona discharge is performed or plasma is irradiated to form the modulus adjusting areas 420 may penetrate up to a depth (e.g., a uniform depth) from the surface of the adhesive layer 400. Thus, as shown in FIG. 4, the modulus adjusting areas 420 may extend in the depth direction of the adhesive layer 400 from the surface of the adhesive layer 400 and may be surrounded by the base 410 in the adhesive layer 400.

At this time, if a depth T2 of the modulus adjusting area 420 is too shallow, an elongation percentage of the adhesive layer 400 in the first direction X may be undesirably low, and if the depth T2 of the modulus adjusting area 420 is too deep, the adhesive layer 400 may partially break or crack when the adhesive layer 400 is elongated in (e.g., extended in) the first direction X. Accordingly, in order to increase the elongation percentage and stably maintain the adhesive layer 400, the depth T2 of the modulus adjusting area 420 may be in a range of 10% to 90% and, in one embodiment, may be in a range of 10% to 50%, of a thickness T1 of the adhesive layer 400.

Also, a width W of the modulus adjusting area 420 may be determined by a beam width of plasma. The width W of the modulus adjusting area 420 is a width on the surface of the adhesive layer 400, and adhesive strength of the adhesive layer 400 may decrease as the width W of the modulus adjusting area 420 increases. Accordingly, an entire area of the modulus adjusting areas 420 on the surface of the adhesive layer 400 may be in a range of 5% to 20% and, in one embodiment, may be in a range of 5% to 10%, of a surface area of the adhesive layer 400.

A boundary region in which adhesive strength of an adhesive changes along a gradient (e.g., gradually changes) may be formed between the modulus adjusting area 420 and the base 410. Accordingly, a modulus of the adhesive layer 400 may not rapidly or abruptly change or vary between the modulus adjusting area 420 and the base 410.

Figure 5:
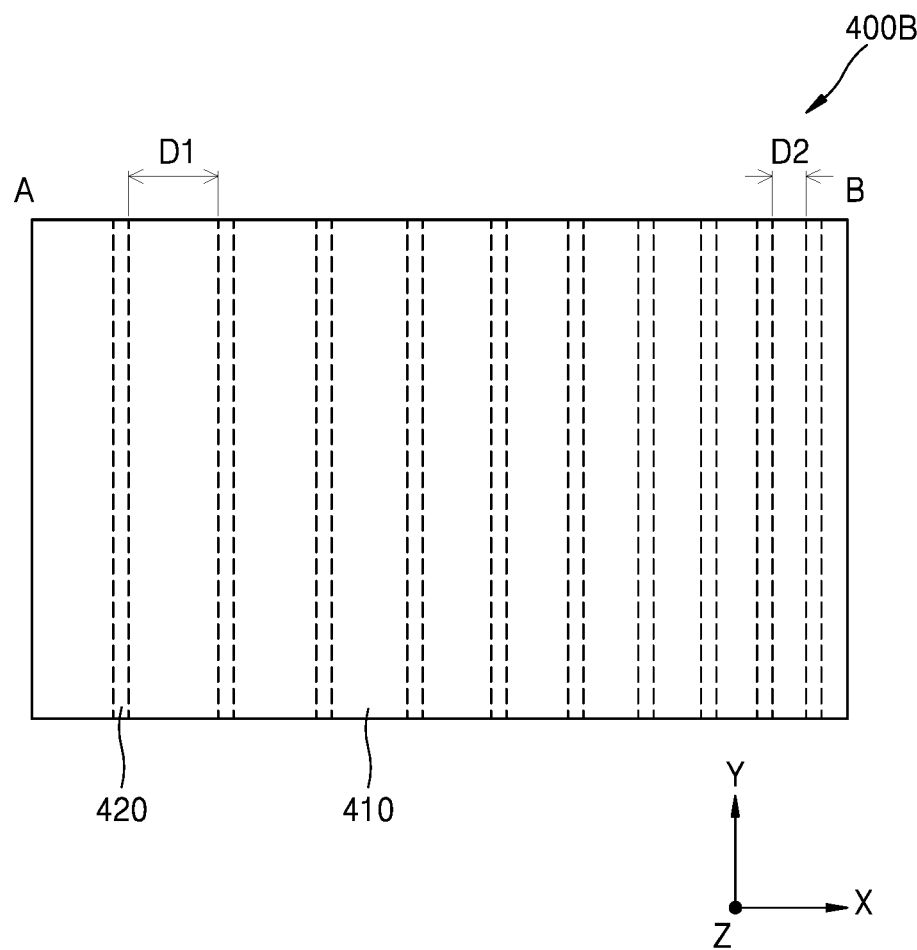
FIG. 5 is a plan view of an adhesive layer according to another exemplary embodiment of the present invention.

FIG. 5 is a plan view of an adhesive layer 400B according to another exemplary embodiment of the present invention.

Referring to FIG. 5, the adhesive layer 400B may include the base 410 and the plurality of modulus adjusting areas 420 formed in a partial region of the base 410. The modulus adjusting areas 420 may form a stripe pattern by being separated from each other along the first direction X and may have a smaller modulus than the base 410. Accordingly, a first elongation percentage of the adhesive layer 400B in the first direction X may be greater than a second elongation percentage of the adhesive layer 400B in the second direction Y.

Also, intervals between adjacent ones of the modulus adjusting areas 420 may decrease from one edge A to another edge B of the adhesive layer 400B (D1>D2). In this embodiment, the one edge A is close to the frame F shown in FIG. 1 and the other edge B is opposite to the one edge A.

When the intervals between adjacent ones of the modulus adjusting areas 420 decrease from the one edge A to the other edge B, the first elongation percentage may increase from the one edge A to the other edge B. Accordingly, when the flexible display unit 10 of FIG. 1 is wound to have a roll shape, a stress accumulated from the one edge A to the other edge B may be further effectively distributed.

Figure 6:
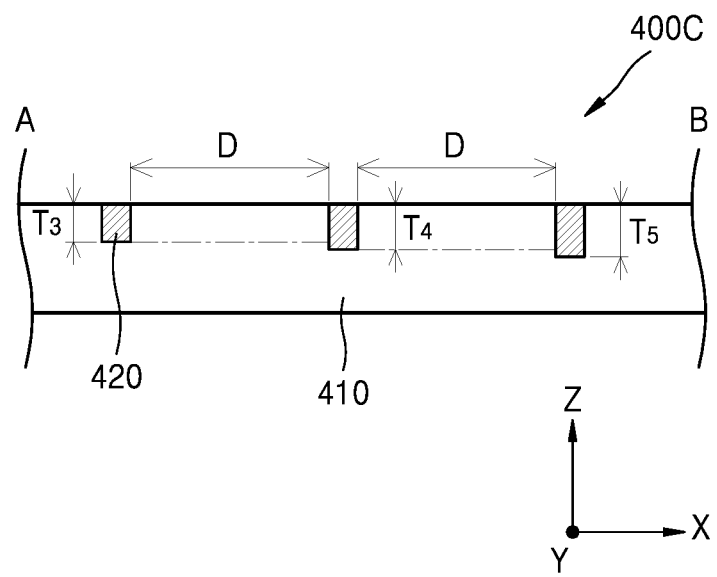
FIG. 6 is a cross-sectional view taken along the line II-II' of FIG. 3, according to another exemplary embodiment of the present invention.

FIG. 6 is a cross-sectional view taken along the line II-II' of FIG. 3 according to another exemplary embodiment of the present invention.

Referring to FIG. 6, an adhesive layer 400C may include the base 410 and the plurality of modulus adjusting areas 420 formed in a partial region of the base 410. The modulus adjusting areas 420 are separated from each other in the first direction X and may extend in the second direction Y.

The modulus adjusting areas 420 may have a smaller modulus than the base 410. Accordingly, a first elongation percentage of the adhesive layer 400C in the first direction X may be greater than a second elongation percentage of the adhesive layer 400C in the second direction Y.

Depths of the modulus adjusting areas 420 may increase from one edge A to another edge B of the adhesive layer 400C (T3<T4<T5). As such, when the depths of the modulus adjusting areas 420 increase from the one edge A to the other edge B of the adhesive layer 400C, the first elongation percentage may increase from the one edge A to the other edge B even when intervals D between adjacent ones of the modulus adjusting areas 420 are uniform. Accordingly, when the flexible display unit 10 of FIG. 1 is wound to have a roll shape, a stress accumulated from the one edge A to the other edge B may be further effectively distributed.

In FIG. 6, the intervals D between adjacent ones of the modulus adjusting areas 420 are uniform, but exemplary embodiments of the present invention are not limited thereto. For example, the depths of the modulus adjusting areas 420 may increase from the one edge A to the other edge B of the adhesive layer 400C while the intervals D between adjacent ones of the modulus adjusting areas 420 may gradually decrease, as shown in FIG. 5.

Figure 7:
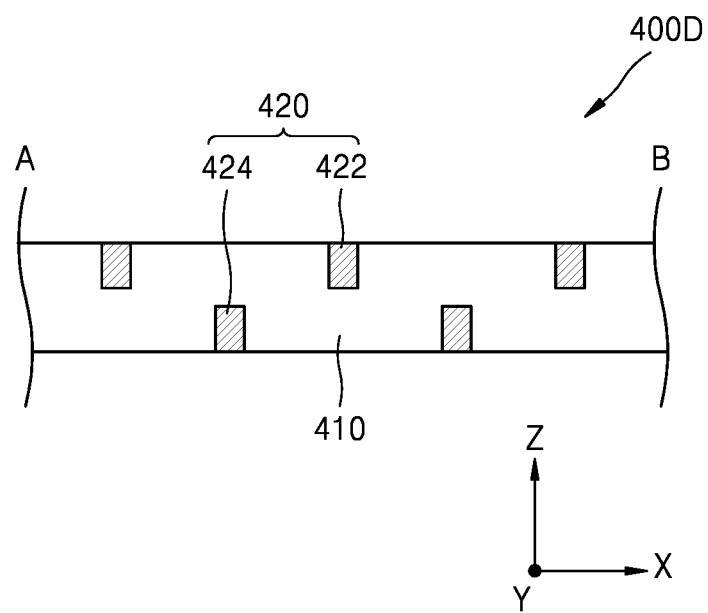
FIG. 7 is a cross-sectional view taken along the line II-II' of FIG. 3, according to another exemplary embodiment of the present invention.

FIG. 7 is a cross-sectional view taken along the line II-II' of FIG. 3 according to another exemplary embodiment of the present invention.

Referring to FIG. 7, an adhesive layer 400D may include the base 410 and the plurality of modulus adjusting areas 420 formed in the base 410. The modulus adjusting areas 420 may form a stripe pattern by being separated from each other in the X direction and may have a smaller modulus than the base 410. Accordingly, a first elongation percentage of the adhesive layer 400D in the first direction X may be greater than a second elongation percentage of the adhesive layer 400D in the second direction Y.

The modulus adjusting areas 420 may include a plurality of first modulus adjusting areas 422 extending in a depth direction of the adhesive layer 400D from a first surface of the adhesive layer 400D and a plurality of second modulus adjusting areas 424 extending in a depth direction of the adhesive layer 400D from a second surface of the adhesive layer 400D. The first modulus adjusting areas 422 and the second modulus adjusting areas 424 may be alternately arranged along the first direction X. Thus, the first elongation percentage may be further increased while adhesive strength of the adhesive layer 400D is maintained, and accordingly, when the flexible display unit 10 of FIG. 1 is wound to have a roll shape, a stress accumulated from one edge A to another edge B of the adhesive layer 400D may be further effectively distributed.

Figure 8:
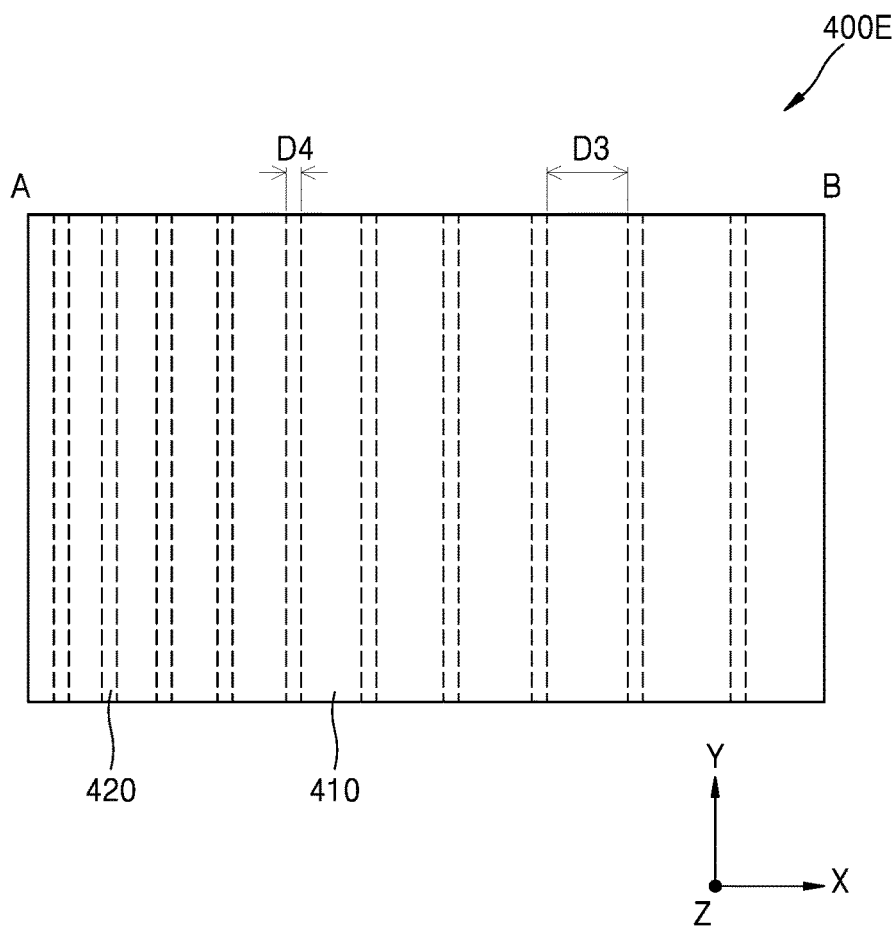
FIG. 8 is a plan view of an adhesive layer according to another exemplary embodiment of the present invention.

FIG. 8 is a plan view of an adhesive layer 400E according to another exemplary embodiment of the present invention.

Referring to FIG. 8, the adhesive layer 400E may include the base 410 and the plurality of modulus adjusting areas 420 formed in the base 410. The plurality of modulus adjusting areas 420 may form a stripe pattern by being spaced from (e.g., separated from) each other in the first direction X and may have a lower modulus than the base 410. Accordingly, a first elongation percentage of the adhesive layer 400E in the first direction X may be greater than a second elongation percentage of the adhesive layer 400E in the second direction Y.

Also, intervals between the modulus adjusting areas 420 may decrease from another edge B of the adhesive layer 400E to one edge A (D3>D4), and thus, the first elongation percentage may increase towards the one edge A. In one embodiment, the one edge A is close to the frame F of FIG. 1, and the other edge B is opposite to the one edge A.

When the flexible display unit 10 of FIG. 1 is wound to have a roll shape, the radius of curvature of the flexible display unit 10 decreases towards the one edge A, and thus, stress caused by small radius of curvature may increase towards the one edge A. Accordingly, by increasing the first elongation percentage the adhesive layer 400E to the one edge A, the stress caused by the small radius of curvature may be distributed.

Meanwhile, as can be seen in FIG. 8, the intervals between the modulus adjusting areas 420 are reduced in order to increase the first elongation percentage towards the one edge A, but this exemplary embodiment is not limited thereto. In other words, in order to increase the first elongation percentage towards the one edge, A, the depths of the modulus adjusting areas 420 may gradually increase towards the one edge A as described with reference to FIG. 6.

Figure 9:
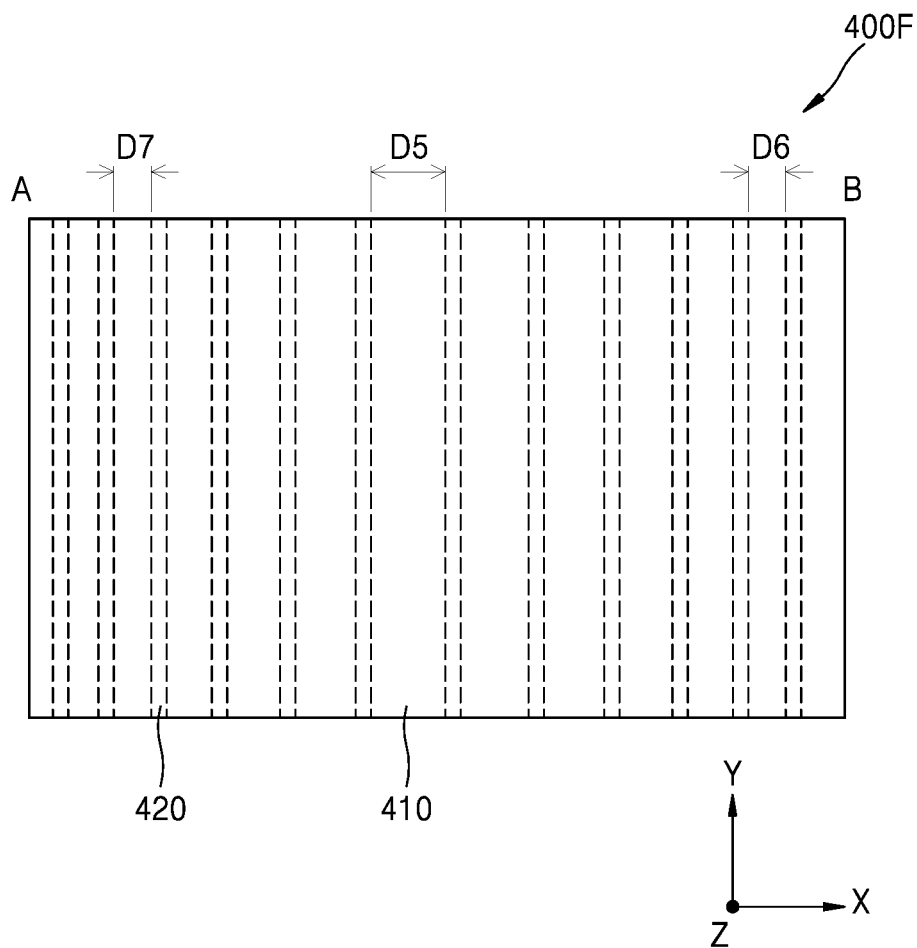
FIG. 9 is a plan view of an adhesive layer according to another exemplary embodiment of the present invention.

FIG. 9 is a plan view of an adhesive layer 400F according to another exemplary embodiment of the present invention.

Referring to FIG. 9, the adhesive layer 400F may include the base 410 and the plurality of modulus adjusting areas 420 formed in the base 410. The plurality of modulus adjusting areas 420 may form a stripe pattern by being spaced from (e.g., separated from) each other in the first direction X and may have a lower modulus than the base 410. Accordingly, a first elongation percentage of the adhesive layer 400F in the first direction X may be greater than a second elongation percentage of the adhesive layer 400F in the second direction Y.

Also, intervals between the modulus adjusting areas 420 may decrease from a center portion of the adhesive layer 400F to one edge A and another edge B (D5>D6 and D5>D7). In one embodiment, the one edge A is close to the frame F of FIG. 1, and the other edge B is opposite to the one edge A.

As described above with reference to FIG. 5, when the intervals between the modulus adjusting areas 420 decrease towards the other edge B, the first elongation percentage may increase towards the other edge B. Accordingly, when the flexible display unit 10 of FIG. 1 is wound to have a roll shape, stress accumulated towards the other edge B may be further effectively distributed. Also, when the flexible display unit 10 of FIG. 1 is wound to have a roll shape, a radius of curvature of the flexible display unit 10 decreases towards the one end A, and thus, stress caused by small radius of curvature may increase towards the one end A. Accordingly, by increasing the first elongation percentage from the center portion of the adhesive layer 400F to the one edge A, the stress caused by the small radius of curvature may be distributed.

Meanwhile, as can be seen in FIG. 9, the intervals between the modulus adjusting areas 420 decrease toward the one edge A and the other edge B, but this exemplary embodiment is not limited thereto, and depths of the modulus adjusting areas 420 may increase toward the one edge A and the other edge B as described above, for example, with reference to FIG. 6 in order to increase the first elongation percentage towards the one edge A and the other edge B.

As described above, according to one or more exemplary embodiments of the present invention, when a flexible display device is wound in a roll shape, a stress accumulated relatively far from a central axis is effectively distributed, thereby reducing or preventing damage, such as interlayer detachment, caused by the accumulated stress.

While one or more exemplary embodiments of the present invention have been described with reference to the figures, it will be understood by those of ordinary skill in the art that various changes in form and details may be made therein without departing from the spirit and scope as defined by the following claims and their equivalents.

What is claimed is:

1. A display device comprising a flexible display unit configured to be wound in a roll shape, the flexible display unit comprising:
    a flexible substrate;
    a display layer on the flexible substrate; a thin-film encapsulation layer sealing the display layer; a functional layer on the thin-film encapsulation layer; and an adhesive layer between the thin-film encapsulation layer and the functional layer, the adhesive layer comprising a base and a plurality of modulus adjusting areas having a line shape in a region of the base,
    wherein the plurality of modulus adjusting areas are separated from each other along a first direction to form a stripe pattern,
    wherein the base and the plurality of modulus adjusting areas comprise a same material, and
    wherein a first modulus of the base is greater than a second modulus of the plurality of modulus adjusting areas;
    wherein the base and the plurality of modulus adjusting areas are alternately arranged on a surface of the adhesive layer in the first direction, and
    wherein the plurality of modulus adjusting areas extend in a depth direction of the adhesive layer from the surface of the adhesive layer.

2. The display device of claim 1, wherein a first elongation percentage of the adhesive layer in the first direction is greater than a second elongation percentage of the adhesive layer in a second direction crossing the first direction.

3. The display device of claim 2, wherein the first direction and the second direction are perpendicular to each other.

4. The display device of claim 2, wherein each of the plurality of modulus adjusting areas extends in the second direction.

5. The display device of claim 2, further comprising a frame configured to accommodate the flexible display unit wound in the roll shape,
    wherein the first direction is a direction along which the flexible display unit is unwound from the frame.

6. The display device of claim 5, wherein the first elongation percentage increases from one edge to an opposite edge of the adhesive layer,
    wherein the one edge is closer to the frame than the opposite edge.

7. The display device of claim 6, wherein intervals between adjacent ones of the plurality of modulus adjusting areas decrease from the one edge to the opposite edge.

8. The display device of claim 6, wherein depths of the plurality of modulus adjusting areas increase from the one edge to the opposite edge.

9. The display device of claim 1, wherein a depth of each of the plurality of modulus adjusting areas is in a range of 10% to 90% of a thickness of the adhesive layer.

10. The display device of claim 1, wherein a depth of each of the plurality of modulus adjusting areas is in a range of 10% to 50% of a thickness of the adhesive layer.

11. The display device of claim 1, wherein the plurality of modulus adjusting areas comprise a plurality of first modulus adjusting areas extending in a depth direction of the adhesive layer from a first surface of the adhesive layer and a plurality of second modulus adjusting areas extending in a depth direction of the adhesive layer from a second surface of the adhesive layer, the second surface being opposite to the first surface.

12. The display device of claim 11, wherein the plurality of first modulus adjusting areas and the plurality of second modulus adjusting areas are alternately arranged.

13. The display device of claim 1, wherein the display layer comprises an organic light-emitting diode and a thin-film transistor electrically connected to the organic light-emitting diode.

* * * * *